(12) United States Patent
Haneda et al.

(10) Patent No.: US 10,680,554 B2
(45) Date of Patent: Jun. 9, 2020

(54) CIRCUIT DEVICE, OSCILLATOR, ELECTRONIC APPARATUS, AND VEHICLE

(71) Applicant: Seiko Epson Corporation, Tokyo (JP)

(72) Inventors: Hideo Haneda, Matsumoto (JP); Akio Tsutsumi, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/219,995

(22) Filed: Dec. 14, 2018

(65) Prior Publication Data

US 2019/0190448 A1    Jun. 20, 2019

(30) Foreign Application Priority Data

Dec. 15, 2017    (JP) .................................. 2017-240161

(51) Int. Cl.

| H03B 5/30 | (2006.01) |
|---|---|
| B81B 7/00 | (2006.01) |
| H03L 1/04 | (2006.01) |
| H03L 7/099 | (2006.01) |
| H03M 1/46 | (2006.01) |
| H03L 7/093 | (2006.01) |
| H03B 5/36 | (2006.01) |
| H03L 1/02 | (2006.01) |

(52) U.S. Cl.
CPC ............... *H03B 5/30* (2013.01); *B81B 7/008* (2013.01); *H03B 5/366* (2013.01); *H03L 1/027* (2013.01); *H03L 1/04* (2013.01); *H03L 7/093* (2013.01); *H03L 7/099* (2013.01); *H03M 1/46* (2013.01); *B81B 2207/03* (2013.01); *H03B 2200/0062* (2013.01); *H03B 2201/0208* (2013.01)

(58) Field of Classification Search
CPC .. H03B 5/30; H03B 5/366; H03B 2201/0208; H03B 2200/0062; H03L 7/093; H03L 7/099; H03L 1/027; H03L 1/04
See application file for complete search history.

(56) References Cited

U.S. PATENT DOCUMENTS

| 5,898,345 A * | 4/1999 | Namura | ................. H03B 5/368 |
|---|---|---|---|
| | | | 331/158 |
| 2008/0150648 A1* | 6/2008 | Maeda | .................... H03C 3/225 |
| | | | 331/177 V |
| 2009/0115542 A1* | 5/2009 | Nakamura | ............... H03B 5/04 |
| | | | 331/176 |

(Continued)

FOREIGN PATENT DOCUMENTS

JP    2017-085535 A    5/2017

*Primary Examiner* — Jeffrey M Shin
(74) *Attorney, Agent, or Firm* — Harness, Dickey & Pierce, P.L.C.

(57) ABSTRACT

A circuit device includes a drive circuit driving a resonator, an oscillation circuit having the resonator and a variable capacitance circuit coupled to an oscillation loop including the drive circuit, and a D/A converter circuit that performs D/A conversion on frequency control data and outputs a first voltage signal and a second voltage signal which are differential signals. The variable capacitance circuit includes a first variable capacitance capacitor, to one end of which the first voltage signal is input and, to the other end of which a first bias voltage is input and a second variable capacitance capacitor, to one end of which the second voltage signal is input and, to the other end of which a second bias voltage is input.

20 Claims, 10 Drawing Sheets

(56) References Cited

U.S. PATENT DOCUMENTS

| | | | |
|---|---|---|---|
| 2014/0167871 A1* | 6/2014 | Ahmed .................... | H01G 2/00 331/177 V |
| 2015/0116044 A1* | 4/2015 | Itasaka ................... | H03B 5/362 331/62 |
| 2017/0117903 A1 | 4/2017 | Fukuzawa et al. | |

* cited by examiner

CIRCUIT DEVICE, OSCILLATOR, ELECTRONIC APPARATUS, AND VEHICLE

BACKGROUND

1. Technical Field

The present invention relates to a circuit device, an oscillator, an electronic apparatus, a vehicle, and the like.

2. Related Art

An oscillator that performs temperature compensation processing of an oscillation frequency by using temperature detection data which is a result of A/D conversion of a temperature detection voltage (analog signal) from a temperature sensor and reduces fluctuations of the oscillation frequency when a temperature changes is known. For example, a temperature compensated oscillator called temperature compensated crystal oscillator (TCXO) is known. The TCXO is used as a reference signal source or the like in, for example, a mobile communication terminal, a GPS related device, a wearable device, an in-vehicle device or the like.

In such an oscillator such as a TCXO, high frequency stability is desired. For example, JP-A-2017-85535 discloses a technique of changing the frequency control data to be output to an oscillation signal generator circuit from first frequency control data to second frequency control data in k×LSB units (k is an integer of 1 or more) when the frequency control data obtained by the temperature compensation processing changes from the first frequency control data to the second frequency control data. It is possible to reduce abrupt changes in the frequency drift amount by changing the frequency control data in k×LSB units. In JP-A-2017-85535, a single-ended output D/A converter circuit performs D/A conversion of frequency control data to a control voltage, and the single-end output control voltage is input to the variable capacitance capacitor of an oscillation circuit.

In the oscillator as described above, a variable capacitance capacitor for controlling the oscillation frequency of the oscillation circuit is provided, and the oscillation frequency is controlled by controlling the control voltage to be input to the variable capacitance capacitor. In a case where this control voltage fluctuates due to noise or the like, frequency drift may occur due to the fluctuations, and the accuracy of the oscillation frequency may decrease.

SUMMARY

An advantage of some aspects of the invention is to solve at least a part of the problems described above, and the invention can be implemented as the following forms or embodiments.

An aspect of the invention is relates to a circuit device including an oscillation circuit that includes a drive circuit driving a resonator, and a variable capacitance circuit coupled to an oscillation loop including the resonator and the drive circuit, and a D/A converter circuit that performs D/A conversion on frequency control data and outputs a first voltage signal and a second voltage signal which are D/A converted voltage signals of differential signals corresponding to the frequency control data, in which the variable capacitance circuit includes a first variable capacitance capacitor, to one end of which the first voltage signal is input and, to the other end of which a first bias voltage is input, and a second variable capacitance capacitor, to one end of which the second voltage signal is input and, to the other end of which a second bias voltage is input.

According to the aspect of the invention, the D/A converter circuit outputs differential signals as a result of D/A conversion of the frequency control data, and the first voltage signal of the first and second voltage signals constructing the differential signals is input to one end of the first variable capacitance capacitor and the second voltage signal is input to one end of the second variable capacitance capacitor. In a case where an in-phase voltage fluctuation occurs in the first and second voltage signals, since the potential difference between both ends of the first variable capacitance capacitor and the potential difference between both ends of the second variable capacitance capacitor change in opposite directions, the capacitance value of the first variable capacitance capacitor and the capacitance value of the second variable capacitance capacitor change in opposite directions. As a result, it is possible to reduce the fluctuations in the oscillation frequency in a case where an in-phase voltage fluctuation occurs in the first and second voltage signals and to reduce the deterioration in the accuracy of the oscillation frequency.

In the aspect of the invention, the first bias voltage and the second bias voltage may be the same voltage.

With this configuration, the capacitance value of the first variable capacitance capacitor is controlled by the potential difference between the first voltage signal and the first bias voltage, and the capacitance value of the second variable capacitance capacitor is controlled by the potential difference between the second voltage signal and the second bias voltage which is the same voltage as the first bias voltage. When the first and second voltage signals constructing the differential signals fluctuate in phase, the capacitance values of the first and second variable capacitance capacitors change in the opposite direction, and therefore fluctuations in the oscillation frequency of the oscillation circuit may be reduced. The same voltage may be the same within the range that achieves the effect of the invention and may not be exactly the same.

In the aspect of the invention, the variable capacitance circuit may include a coupling node coupled to the oscillation loop and a capacitor provided between the other ends of the first variable capacitance capacitor and the second variable capacitance capacitor.

With this configuration, the other ends of the first and second variable capacitance capacitors and the coupling node coupled to the oscillation loop are DC-cut by the capacitor. As a result, the first and second bias voltages having the same voltage may be supplied to the other ends of the first and second variable capacitance capacitors.

In the aspect of the invention, the variable capacitance circuit may include a first capacitor provided between a coupling node coupled to the oscillation loop and the other end of the first variable capacitance capacitor and a second capacitor provided between the coupling node and the other end of the second variable capacitance capacitor.

With this configuration, the other end of the first variable capacitance capacitor and the coupling node coupled to the oscillation loop is DC-cut by the first capacitor, and the other end of the second variable capacitance capacitor and the coupling node coupled to the oscillation loop is DC cut by the second capacitor. As a result, the first bias voltage may be supplied to the other end of the first variable capacitance capacitor, and the second bias voltage different from the first bias voltage may be supplied to the other end of the second variable capacitance capacitor. As a result, it is possible to make the characteristic of the changes of the oscillation frequency with respect to the voltage changes of the differential signals (first and second voltage signals) closer to a desirable characteristic. For example, it is possible to expand the range in which the oscillation frequency changes linearly with respect to the potential difference of the first and second voltage signals.

In the aspect of the invention, the variable capacitance circuit may include a third variable capacitance capacitor, to one end of which the first voltage signal is input and, to the other end of which a third bias voltage is input, and a fourth variable capacitance capacitor, to one end of which the second voltage signal is input and, to the other end of which a fourth bias voltage is input.

With this configuration, the third variable capacitance capacitor is provided in parallel to the first variable capacitance capacitor, and the fourth variable capacitance capacitor is provided in parallel to the second variable capacitance capacitor. As a result, it is possible to make the characteristic of the changes of the oscillation frequency with respect to the changes of the differential signals closer to more desirable characteristic. For example, it is possible to make the characteristics of the changes of the capacitance values with respect to the changes of the differential signals different between the first and third variable capacitance capacitors by making the first and third bias voltages to be supplied to the other ends of the first and third variable capacitance capacitors different. Similarly, it is possible to make the characteristics of the changes of the capacitance values with respect to the changes of the differential signals different between the second and fourth variable capacitance capacitors by making the second and fourth bias voltages to be supplied to the other ends of the second and fourth variable capacitance capacitors different.

In the aspect of the invention, the third bias voltage and the fourth bias voltage may be the same voltage.

Also in the aspect of the invention, it is possible to make the characteristic of the changes of the oscillation frequency with respect to the changes of the differential signals closer to more desirable characteristic. For example, different bias voltages are supplied to the other ends of the first and third variable capacitance capacitors by making the first bias voltage and third bias voltage different. In addition, different bias voltages are supplied to the other ends of the second and fourth variable capacitance capacitors by making the second bias voltage different from the fourth bias voltage which is the same voltage as the third bias voltage. As a result, it is possible to make the characteristics of the changes of the capacitance values with respect to the changes of the differential signals different between the first and the third variable capacitance capacitors and different between the second and fourth variable capacitance capacitors.

In the aspect of the invention, the circuit device may include a first ground capacitor provided between a first node to which one end of the first variable capacitance capacitor is connected and to which the first voltage signal is input and a ground node, and a second ground capacitor provided between a second node to which one end of the second variable capacitance capacitor is connected and to which the second voltage signal is input and the ground node.

With this configuration, the oscillation loop and the ground node may be AC-connected via the first variable capacitance capacitor and the first ground capacitor, and the oscillation loop and the ground node may be AC-connected via the second variable capacitance capacitor and the second ground capacitor. As a result, it is possible to reduce deterioration of the oscillation characteristic of the oscillation circuit. For example, it is possible to reduce deterioration in the phase noise characteristic of the oscillation signal.

In the aspect of the invention, the D/A converter circuit may include a delta-sigma converter circuit that performs delta-sigma conversion on the frequency control data and outputting differential conversion signals, and a low-pass filter that performs differential low-pass filter processing on the differential conversion signals and outputting the D/A converted voltage signals of the differential signals.

The frequency control data is converted into low bit data such as 1 bit, for example, by performing delta-sigma conversion on the frequency control data. The quantization noise when converted into the low bit data is noise-shaped in the delta-sigma conversion, and the influence of the oscillation signal on the in-phase noise may be reduced. In addition, it is possible to output D/A converted voltage signals of differential signals corresponding to the frequency control data by performing differential low-pass filter processing on the differential conversion signals which are the result of the delta-sigma conversion. Then, it is possible to control the oscillation frequency by the frequency control data by controlling the capacitance values of the first and second variable capacitance capacitors by the differential signals. In addition, since the D/A converted voltage signals are differential signals, it is possible to reduce the fluctuations of the oscillation frequency due to in-phase voltage fluctuations.

In the aspect of the invention, the low-pass filter may include a first ground capacitor provided between a first node to which one end of the first variable capacitance capacitor is connected and a ground node, and a second ground capacitor provided between a second node to which one end of the second variable capacitance capacitor is connected and the ground node, in which the low-pass filter may perform the low-pass filter processing using the first ground capacitor and the second ground capacitor, output the first voltage signal to the first node, and output the second voltage signal to the second node.

The first and second nodes correspond to differential output nodes of the low-pass filter. According to the aspect of the invention, among the capacitors constructing the low-pass filter, the capacitor coupled to the differential output node may also be used as a ground capacitor for connecting the oscillation loop to the ground node in AC manner.

Another aspect of the invention relates to an oscillator including any of the circuit devices described above and the resonator.

Still another aspect of the invention relates to an electronic apparatus including any of the circuit devices described above.

Still another aspect of the invention relates to a vehicle including any of the circuit devices described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The present embodiment described below does not unduly limit the contents of the invention described in the appended claims, and not all of the configurations described in the embodiment are necessarily indispensable as a solving means of the invention.

1. First Configuration Example of Circuit Device

Figure 1:
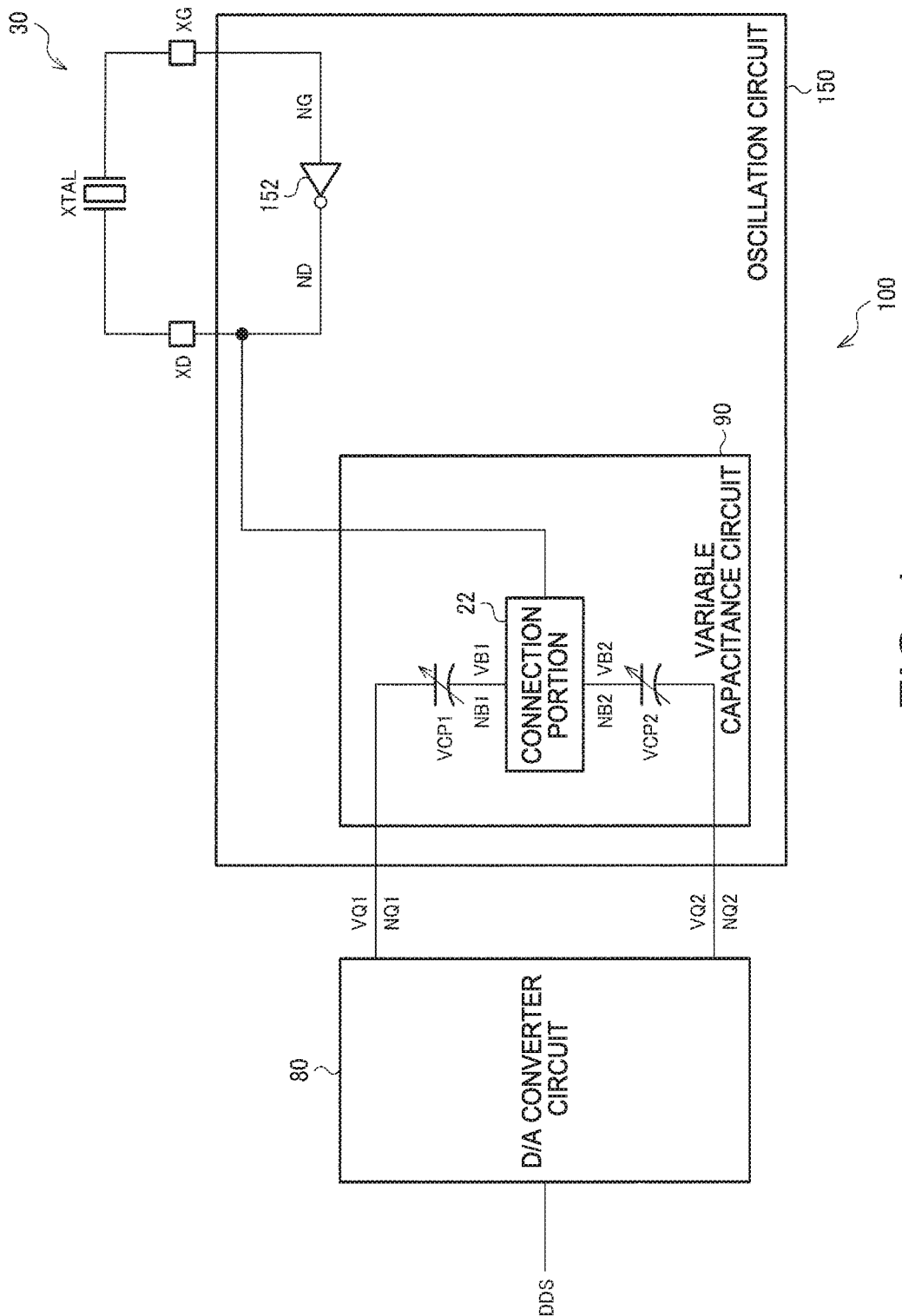
FIG. 1 is a first configuration example of a circuit device.

FIG. 1 is a first configuration example of a circuit device 100. The circuit device 100 includes an oscillation circuit 150 and a D/A converter circuit 80. In addition, the circuit device 100 includes a terminal XD (pad, first resonator terminal) to which one end of a resonator XTAL is connected and a terminal XG (pad, second resonator terminal) to which the other end of the resonator XTAL is connected.

The D/A converter circuit 80 performs D/A conversion on frequency control data DDS and outputs D/A converted voltage signals of differential signals corresponding to the frequency control data DDS. The frequency control data DDS is data for controlling the oscillation frequency of the oscillation circuit 150. Temperature compensation is performed by generating the frequency control data DDS so as to reduce or cancel the temperature characteristic (temperature dependence of oscillation frequency) of the resonator XTAL and the oscillation circuit 150. For example, a digital signal processing circuit 50 shown in FIG. 10 outputs the frequency control data DDS to the D/A converter circuit 80. The differential signals output from the D/A converter circuit 80 are constructed of a voltage signal VQ1 (first voltage signal) and a voltage signal VQ2 (second voltage signal). For example, the D/A converter circuit 80 outputs differential signals in which VQ1-VQ2 becomes smaller as the value of the frequency control data DDS is larger.

The oscillation circuit 150 is coupled to the resonator XTAL via the terminals XD and XG and oscillates the resonator XTAL by driving the resonator XTAL. The oscillation circuit 150 receives the D/A converted voltage signal from the D/A converter circuit 80 and oscillates the resonator XTAL at the oscillation frequency corresponding to the D/A converted voltage signal. The oscillation circuit 150 includes a drive circuit 152 driving the resonator XTAL and a variable capacitance circuit 90 coupled to an oscillation loop 30 of the resonator XTAL.

The drive circuit 152 outputs a drive signal to one end (terminal XD) of the resonator XTAL based on a signal input from the other end (terminal XG) of the resonator XTAL to an input node NG. As shown in FIG. 1, the drive circuit 152 is, for example, an inverter, but is not limited thereto as long as the drive circuit 152 is a circuit which inverts and amplifies an input signal. For example, the oscillation circuit 150 may be a Pierce type oscillation circuit, and in this case, the drive circuit 152 includes a bipolar transistor and a resistor connected between the base and the collector of the bipolar transistor. The base of the bipolar transistor becomes the input node NG, and the collector becomes an output node ND.

The oscillation loop 30 is a feedback path (feedback loop) from the output node ND of the drive circuit 152 to the input node NG. In FIG. 1, only the resonator XTAL is provided between the output node ND of the drive circuit 152 and the input node NG, but the oscillation loop 30 may further include other circuit elements. For example, a capacitor may be inserted in series with the resonator XTAL.

The variable capacitance circuit 90 includes a variable capacitance capacitor VCP1 (first variable capacitance capacitor) and a variable capacitance capacitor VCP2 (second variable capacitance capacitor). In addition, the variable capacitance circuit 90 may include a connection portion 22 (connector circuit).

In the variable capacitance capacitor VCP1, the voltage signal VQ1 is input to one end, and a bias voltage VB1 (first bias voltage) is input to the other end. Specifically, one end of the variable capacitance capacitor VCP1 is coupled to an output node NQ1 (the node from which the voltage signal VQ1 is output) of the D/A converter circuit 80, and the other end is coupled to a node NB1 to which the bias voltage VB1 is supplied. In the variable capacitance capacitor VCP2, the voltage signal VQ2 is input to one end, and a bias voltage VB2 (second bias voltage) is input to the other end. Specifically, one end of the variable capacitance capacitor VCP2 is coupled to an output node NQ2 (the node from which the voltage signal VQ2 is output) of the D/A converter circuit 80, and the other end is coupled to a node NB2 to which the bias voltage VB2 is supplied. The bias voltages VB1 and VB2 may be the same voltage or different voltages.

The variable capacitance capacitors VCP1 and VCP2 are capacitors whose capacitance values are variably controlled according to the potential difference between both ends thereof. Specifically, the larger the potential difference between the both ends of the variable capacitance capacitors VCP1 and VCP2, the larger the capacitance value. For example, the variable capacitance capacitors VCP1 and VCP2 are MOS capacitors (MOS transistors). In the MOS capacitor, the gate node and the source and drain nodes (nodes short-circuiting the source and drain) are defined as nodes on both ends, and the capacitance between both ends changes according to the potential difference between the both ends. In the symbols indicating the variable capacitance capacitors VCP1 and VCP2, the straight-line electrode corresponds to the gate node, and the curve electrode corresponds to the source and drain node.

The connection portion 22 connects the node NB1 at the other end of the variable capacitance capacitor VCP1 and the node NQ2 at the other end of the variable capacitance capacitor VCP2 to the oscillation loop 30. In addition, the connection portion 22 supplies the bias voltages VB1 and VB2 to the nodes NB1 and NB2. Between the node NB1 and the oscillation loop 30 and between the node NB2 and the oscillation loop 30 are AC-connected. For example, the connection portion 22 may include a DC-cut capacitor provided between the nodes NB1 and NB2 and the oscillation loop 30. In FIG. 1, the connection portion 22 is coupled to the output node ND of the drive circuit 152, but the invention is not limited thereto, and the connection portion 22 may be coupled to the input node NG of the drive circuit 152.

The resonator XTAL (oscillator) is, for example, a piezoelectric resonator. The piezoelectric resonator is, for example, a quartz crystal resonator. As the quartz crystal resonator, for example, a quartz crystal resonator whose cut angle vibrates in thickness shear such as AT cut or SC cut. For example, the resonator is a resonator built in a temperature compensated crystal oscillator (TCXO) that does not have a thermostat. Alternatively, the resonator may be a resonator built in an oven-controlled crystal oscillator (OCXO) that has a thermostat. In addition, a surface acoustic wave (SAW) resonator, a micro electro mechanical systems (MEMS) resonator as a silicon resonator formed by using a silicon substrate, or the like may be adopted as the resonator.

According to the above embodiment, the D/A converter circuit 80 outputs differential signals as a result of D/A conversion of the frequency control data DDS, and one voltage signal VQ1 of the voltage signals VQ1 and VQ2 constructing the differential signals is input to one end of the variable capacitance capacitor VCP1 and the other voltage signal VQ2 is input to one end of the variable capacitance capacitor VCP2. As the potential difference VQ1-VQ2 of the voltage signals VQ1 and VQ2 becomes larger, the potential difference between both ends of the variable capacitance capacitor VCP1 and the potential difference between both ends of the variable capacitance capacitor VCP2 become larger, and therefore the capacitance values of the variable capacitance capacitors VCP1 and VCP2 becomes larger. As a result, the oscillation frequency of the oscillation circuit 150 may be controlled by the frequency control data DDS.

In addition, in a case where an in-phase voltage fluctuation (in-phase noise) occurs in the voltage signals VQ1 and VQ2, since the potential difference between both ends of the variable capacitance capacitor VCP1 and the potential difference between both ends of the variable capacitance capacitor VCP2 change in opposite directions, the capacitance value of the variable capacitance capacitor VCP1 and the capacitance value of the variable capacitance capacitor VCP2 change in opposite directions. As a result, it is possible to reduce the fluctuations in the oscillation frequency in a case where an in-phase voltage fluctuation occurs in the voltage signals VQ1 and VQ2 and to reduce the deterioration in the accuracy of the oscillation frequency. This point will be described with reference to FIGS. 2 and 3.

Figure 2:
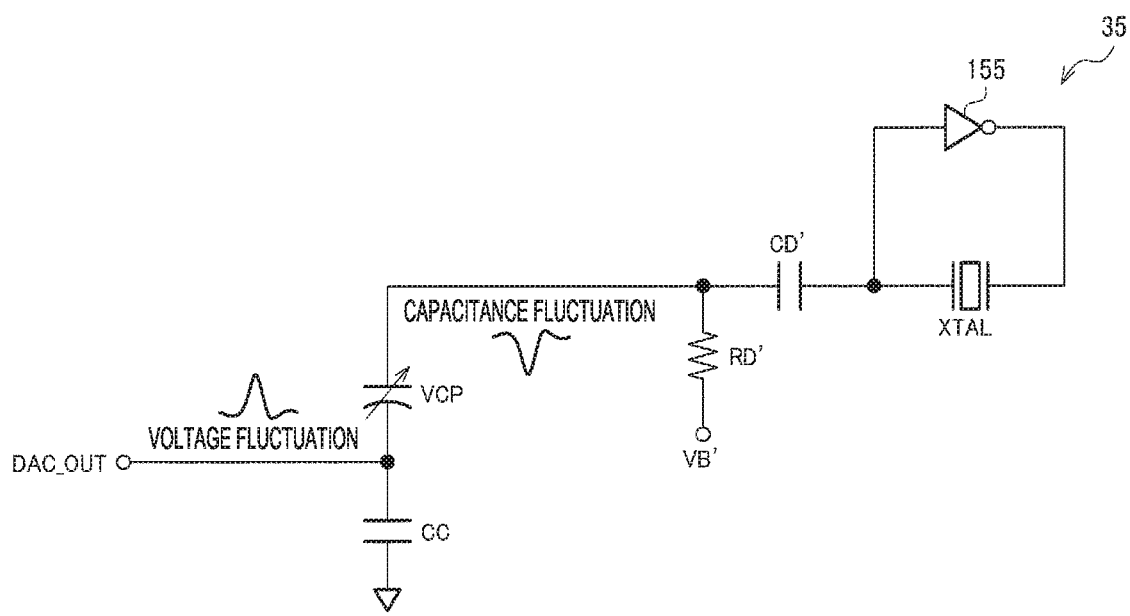
FIG. 2 is a diagram for describing an influence of voltage fluctuations in a case where a single-ended output D/A converter circuit outputs a control voltage to one end of a variable capacitance capacitor.

FIG. 2 is a diagram for describing the influence of voltage fluctuations in a case where the single-ended output D/A converter circuit outputs a control voltage DAC_OUT to one end of a variable capacitance capacitor VCP. In FIG. 2, an oscillation loop 35 in which a drive circuit 155 drives a resonator XTAL' is configured. A capacitor CD', a variable capacitance capacitor VCP, and a capacitor CC are connected in series between the oscillation loop 35 and the ground node. A bias voltage VB' is input to a node between the capacitor CD' and the variable capacitance capacitor VCP via a resistor RD', and the control voltage DAC_OUT (output of the D/A converter circuit) is input to a node between the variable capacitance capacitor VCP and the capacitor CC.

In the configuration of FIG. 2, the capacitance value of the variable capacitance capacitor VCP is controlled by a potential difference VB'-DAC_OUT at both ends of the variable capacitance capacitor VCP. For example, it is assumed that a voltage fluctuation occurs in the control voltage DAC_OUT due to power supply noise or the like. For example, when the control voltage DAC OUT rises, the potential difference VB'-DAC_OUT decreases, and therefore the capacitance value of the variable capacitance capacitor VCP decreases. Since the D/A converter circuit is a single-ended output, this capacitance variation is not canceled, and the oscillation frequency of the oscillation circuit fluctuates. That is, fluctuations in the power supply voltage may propagate to the control voltage to become noise of the control voltage, which may lower the accuracy of the oscillation frequency.

Figure 3:
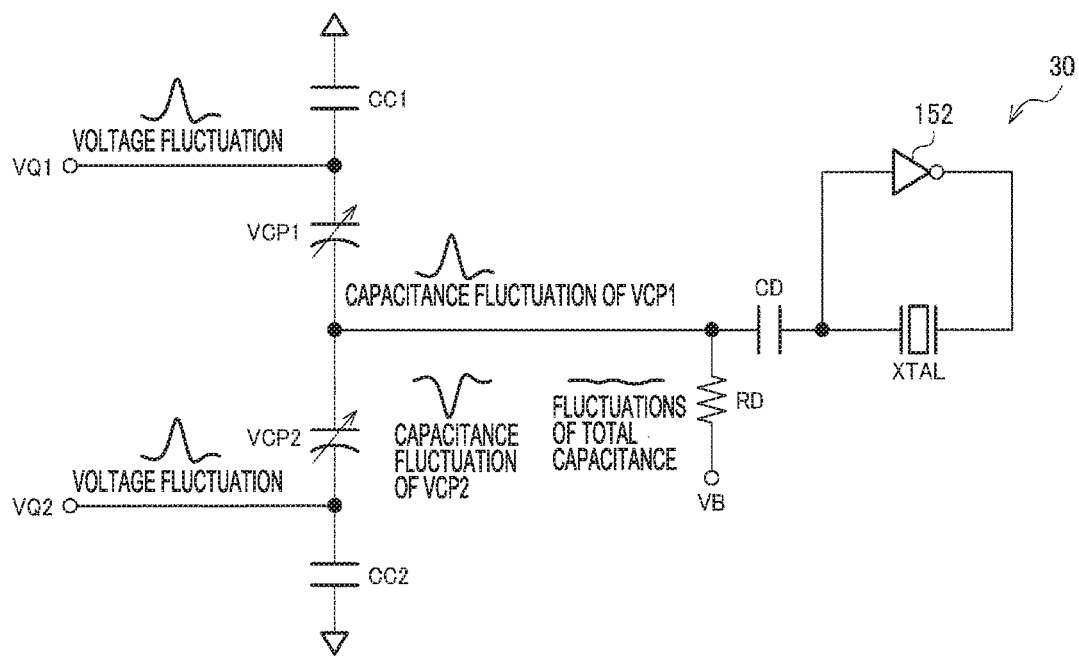
FIG. 3 is a diagram for describing an influence of voltage fluctuations of differential signals (control voltages) in the present embodiment.

FIG. 3 is a diagram for describing the influence of the voltage fluctuations of the differential signals (control voltages) in the present embodiment. In FIG. 3, the oscillation loop 30 in which the drive circuit 152 drives the resonator XTAL is configured. A capacitor CD is connected between the oscillation loop 30 and the node to which the bias voltage VB is input via a resistor RD. The variable capacitance capacitor VCP1 and a capacitor CC1 are connected in series between the node to which the bias voltage VB is input, and the ground node, and the variable capacitance capacitor VCP2 and a capacitor CC2 are connected in series between the node to which the bias voltage VB is input and the ground node. The voltage signal VQ1 (output of the D/A converter circuit 80) is input to a node between the variable capacitance capacitor VCP1 and the capacitor CC1, and the voltage signal VQ2 (output of the D/A converter circuit 80) is input to a node between the variable capacitance capacitor VCP2 and the capacitor CC2.

As shown in FIG. 3, the voltage signals VQ1 and VQ2 from the D/A converter circuit 80 are input to one ends of the variable capacitance capacitors VCP1 and VCP2. In addition, in FIG. 3, the bias voltage VB of the same voltage is supplied to the other ends of the variable capacitance capacitors VCP1 and VCP2. Even in a case where bias voltages of different voltages are supplied to the other ends of the variable capacitance capacitors VCP1 and VCP2, the influence of voltage fluctuations is the same in principle. The capacitance values of the variable capacitance capacitors VCP1 and VCP2 are controlled by a potential differences VQ1-VB and VB-VQ2 at both ends.

It is assumed that the in-phase voltage fluctuations occur in the voltage signals VQ1 and VQ2 (output of D/A converter circuit 80) due to power supply noise or the like. For example, when the voltage signals VQ1 and VQ2 rise, the potential difference VQ1-VB increases and the potential difference VB-VQ2 decreases, and therefore the capacitance value of the variable capacitance capacitor VCP1 increases and the capacitance value of the variable capacitance capacitor VCP2 decreases. For this reason, fluctuations in the capacitance value are canceled (or reduced) as the total (total capacitance) of the capacitance values of the variable capacitance capacitors VCP1 and VCP2, and fluctuations in the oscillation frequency of the oscillation circuit 150 may be reduced.

2. Second Configuration Example of Circuit Device

Figure 4:
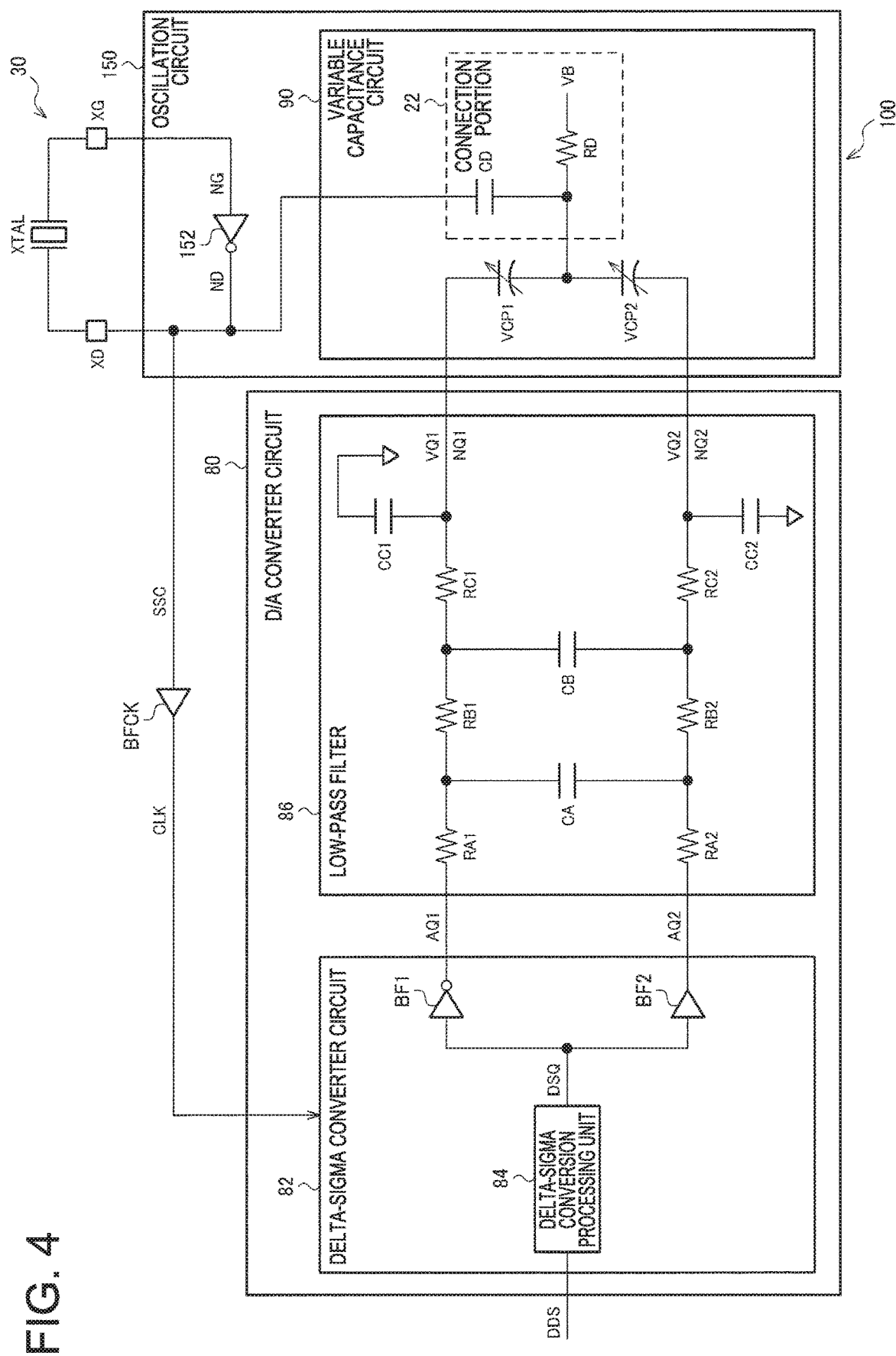
FIG. 4 is a second configuration example of the circuit device and a first detailed configuration example of an oscillation circuit and the D/A converter circuit.

FIG. 4 is a second configuration example of the circuit device 100 and a first detailed configuration example of the oscillation circuit 150 and the D/A converter circuit 80. The circuit device 100 includes the oscillation circuit 150, the D/A converter circuit 80, the terminals XD and XG, and a buffer circuit BFCK. The oscillation circuit includes a variable capacitance circuit 90 and a drive circuit 152. The variable capacitance circuit 90 includes variable capacitance capacitors VCP1 and VCP2 and a connection portion 22. The D/A converter circuit 80 includes a delta-sigma converter circuit 82 and a low-pass filter 86.

The delta-sigma converter circuit 82 includes a delta-sigma conversion processing unit 84 (delta-sigma conversion processing circuit), an inverter BF1, and a buffer circuit BF2.

The delta-sigma conversion processing unit 84 performs delta-sigma conversion on the frequency control data DDS and outputs the result as a conversion signal DSQ (conversion data). The conversion signal DSQ is a 1-bit digital signal. For example, the delta-sigma conversion processing unit 84 performs second-order delta-sigma conversion on the frequency control data DDS, but the order of the delta-sigma conversion is not limited thereto. The delta-sigma conversion processing unit 84 (delta-sigma converter circuit 82) is a logic circuit that operates with a clock signal CLK based on an oscillation signal SSC. For example, the buffer circuit BFCK buffers the oscillation signal SSC and outputs the clock signal CLK to the delta-sigma conversion processing unit 84.

The inverter BF1 and the buffer circuit BF2 convert the conversion signal DSQ into differential signals constructed of a signal AQ1 and a signal AQ2. Specifically, the inverter BF1 logically inverts the conversion signal DSQ and outputs the signal AQ1 having a voltage corresponding to the logic level. The buffer circuit BF2 buffers the conversion signal DSQ at the same logic level and outputs the signal AQ2 having a voltage corresponding to the logic level. That is, when the conversion signal DSQ is at a high level, the signals AQ1 and AQ2 are the ground voltage and the power supply voltage, respectively. When the conversion signal DSQ is at a low level, the signals AQ1 and AQ2 are the power supply voltage and the ground voltage, respectively.

The low-pass filter 86 performs differential low-pass filter processing on the differential signals from the delta-sigma converter circuit 82 and outputs the result as differential signals constructed of the voltage signal VQ1 and the voltage signal VQ2. The low-pass filter 86 is a low-pass filter constructed of passive elements, for example, an RC filter. Here, the third-order RC filter will be described as an example, but the order and configuration of the filter is not limited thereto.

The low-pass filter 86 of FIG. 4 includes resistors RA1, RA2, RB1, RB2, RC1, and RC2, and capacitors CA, CB, CC1, and CC2. The resistors RA1, RB1, and RC1 are connected in series between the output node of the inverter BF1 and one end of the variable capacitance capacitor VCP1. The resistors RA2, RB2, and RC2 are connected in series between the output node of the buffer circuit BF2 and one end of the variable capacitance capacitor VCP2. One end of the capacitor CA is coupled to a node between the resistor RA1 and the resistor RB1, and the other end of the capacitor CA is coupled to a node between the resistor RA2 and the resistor RB2. One end of the capacitor CB is coupled to a node between the resistor RB1 and the resistor RC1, and the other end of the capacitor CB is coupled to a node between the resistor RB2 and the resistor RC2. One end of the capacitor CC1 is coupled to one end of the variable capacitance capacitor VCP1, and the other end of the capacitor CC1 is coupled to the ground node. One end of the capacitor CC2 is coupled to one end of the variable capacitance capacitor VCP2, and the other end of the capacitor CC2 is coupled to the ground node.

The connection portion 22 includes a capacitor CD and a resistor RD. One end of the resistor RD is coupled to the node of the bias voltage VB, and the other end of the resistor RD is coupled to the other ends of the variable capacitance capacitors VCP1 and VCP2. In this example, the nodes NB1 and NB2 of FIG. 1 are commonly coupled to the node of the bias voltage VB, and the bias voltage is VB1=VB2=VB. The bias voltage VB is supplied from, for example, a voltage generator circuit (not shown). One end of the capacitor CD is coupled to the other ends of the variable capacitance capacitors VCP1 and VCP2, and the other end of the capacitor CD is coupled to the oscillation loop 30. For example, the other end of the capacitor CD is coupled to the output node ND of the drive circuit 152.

According to the above embodiment, the bias voltage VB1 (first bias voltage) and the bias voltage VB2 (second bias voltage) shown in FIG. 1 are the same voltage (VB) in FIG. 4.

In this way, the capacitance value of the variable capacitance capacitor VCP1 is controlled by VQ1-VB, and the capacitance value of the variable capacitance capacitor VCP2 is controlled by VB-VQ2. When the voltage signals VQ1 and VQ2 constructing the differential signals fluctuate in phase, the capacitance values of the variable capacitance capacitors VCP1 and VCP2 change in the opposite direction, and therefore fluctuations in the oscillation frequency of the oscillation circuit 150 may be reduced.

In addition, in the present embodiment, the variable capacitance circuit 90 includes a capacitor CD provided between a coupling node coupled to the oscillation loop 30 and the other ends of the variable capacitance capacitor VCP1 (first variable capacitance capacitor) and the variable capacitance capacitor VCP2 (second variable capacitance capacitor). In FIG. 4, the coupling node corresponds to the output node ND of the drive circuit 152, but the coupling node is not limited thereto, and the coupling node may be any node included in the path of the oscillation loop 30. For example, the coupling node may be the input node NG of the drive circuit 152.

In this way, since the other ends of the variable capacitance capacitors VCP1 and VCP2 and the coupling node coupled to the oscillation loop 30 may be DC-cut (AC-connected) by the capacitor CD, the bias voltage VB may be supplied to the other ends of the variable capacitance capacitors VCP1 and VCP2.

In addition, in the embodiment, the circuit device 100 includes the capacitor CC1 (first ground capacitor) and the capacitor CC2 (second ground capacitor). The capacitor CC1 is provided between the output node NQ1 (first node) to which one end of variable capacitance capacitor VCP1 is connected and the voltage signal VQ1 (first voltage signal) is input and the ground node. The capacitor CC2 is provided between the output node NQ2 (second node) to which one end of variable capacitance capacitor VCP2 is connected and the voltage signal VQ2 (second voltage signal) is input and the ground node.

In this way, the oscillation loop 30 and the ground node are connected via the capacitor CD, the variable capacitance capacitor VCP1, and the capacitor CC1, and the oscillation loop 30 and the ground node are connected via the capacitor CD, the variable capacitance capacitor VCP2, and the capacitor CC2. As a result, since the oscillation loop 30 and the ground node are AC-connected, it is possible to reduce the deterioration of the oscillation characteristic of the oscillation circuit 150. For example, it is possible to reduce deterioration in the phase noise characteristic of the oscillation signal SSC.

In addition, in the embodiment, the D/A converter circuit 80 includes the delta-sigma converter circuit 82 and the low-pass filter 86. The delta-sigma converter circuit 82 performs delta-sigma conversion on the frequency control data DDS and outputs differential conversion signals (signals AQ1 and AQ2). The low-pass filter 86 performs differential low-pass filter processing on the differential conversion signals and outputs D/A converted voltage signals (voltage signals VQ1 and VQ2) of the differential signals.

The frequency control data DDS is converted into low-bit data and a D/A converted voltage signal is generated from the low-bit data by performing delta-sigma conversion on the frequency control data DDS. The quantization noise when converted to low-bit data is noise-shaped, and the influence of the oscillation signal SSC on the in-phase noise (low frequency component) may be reduced. In addition, it is possible to output D/A converted voltage signals (voltage signals VQ1 and VQ2) of differential signals corresponding to the frequency control data DDS by performing differential low-pass filter processing on the differential conversion signals (signals AQ1 and AQ2) which are the result of the delta-sigma conversion. Then, it is possible to control the oscillation frequency by the frequency control data DDS by controlling the capacitance values of the variable capacitance capacitors VCP1 and VCP2 by the differential signals. In addition, since the D/A converted voltage signals are differential signals, it is possible to reduce the fluctuations of the oscillation frequency due to in-phase voltage fluctuations (in-phase noise).

In addition, in the present embodiment, the low-pass filter 86 performs low-pass filter processing by using the capacitor CC1 and the capacitor CC2 to output the voltage signal VQ1 to the output node NQ1 to which one end of the variable capacitance capacitor VCP1 is connected. In addition, the voltage signal VQ2 is output to the output node NQ2 to which one end of the variable capacitance capacitor VCP2 is connected.

The capacitors CA and CB of the low-pass filter are provided between the differential nodes and are equivalent to capacitors having a capacitance value twice as much when viewed from one node of the differential nodes. That is, the circuit area is saved by providing the capacitors CA and CB between the differential nodes. On the other hand, the capacitors CC1 and CC2 of the low-pass filter 86 are connected between the output nodes NQ1 and NQ2 and the ground node. As a result, the capacitors CC1 and CC2 constructing the low-pass filter 86 may also be used as a ground capacitor for connecting the oscillation loop 30 to the ground node in AC manner.

3. Various Configuration Examples

The oscillation circuit 150 and the D/A converter circuit 80 are not limited to the above-described configuration, and various modified configuration examples are conceivable. Several configuration examples will be described below. In the following, the same reference numerals are given to the same constituent elements as those already described above, and description of the constituent elements is omitted as appropriate.

Figure 5:
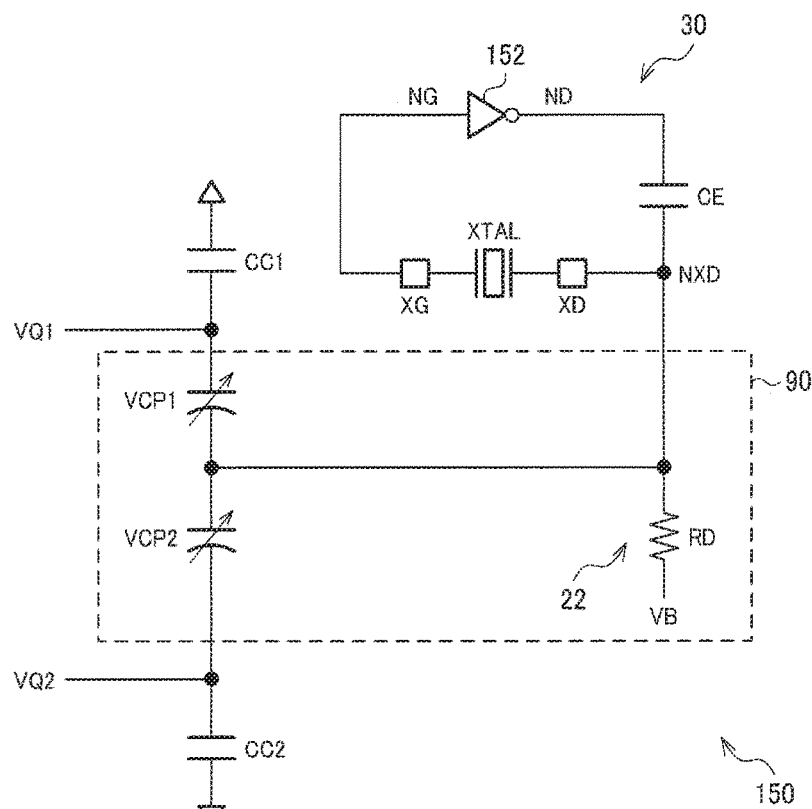
FIG. 5 is a second detailed configuration example of the oscillation circuit.

FIG. 5 is a second detailed configuration example of the oscillation circuit 150. In FIG. 5, the oscillation circuit 150 includes a capacitor CE provided in the oscillation loop 30. One end of the capacitor CE is coupled to the output node ND of the drive circuit 152, and the other end is coupled to a node NXD. In addition, in FIG. 5, the connection portion 22 includes the resistor RD. The node NXD is coupled to the terminal XD, the other ends of the variable capacitance capacitors VCP1 and VCP2, and the other end of the resistor RD.

According to the embodiment of FIG. 5, the node NXD is DC-cut by the capacitor CE with respect to the output node ND of the drive circuit 152. As a result, the bias voltage VB may be supplied to the other ends of the variable capacitance capacitors VCP1 and VCP2 coupled to the node NXD.

Figure 6:
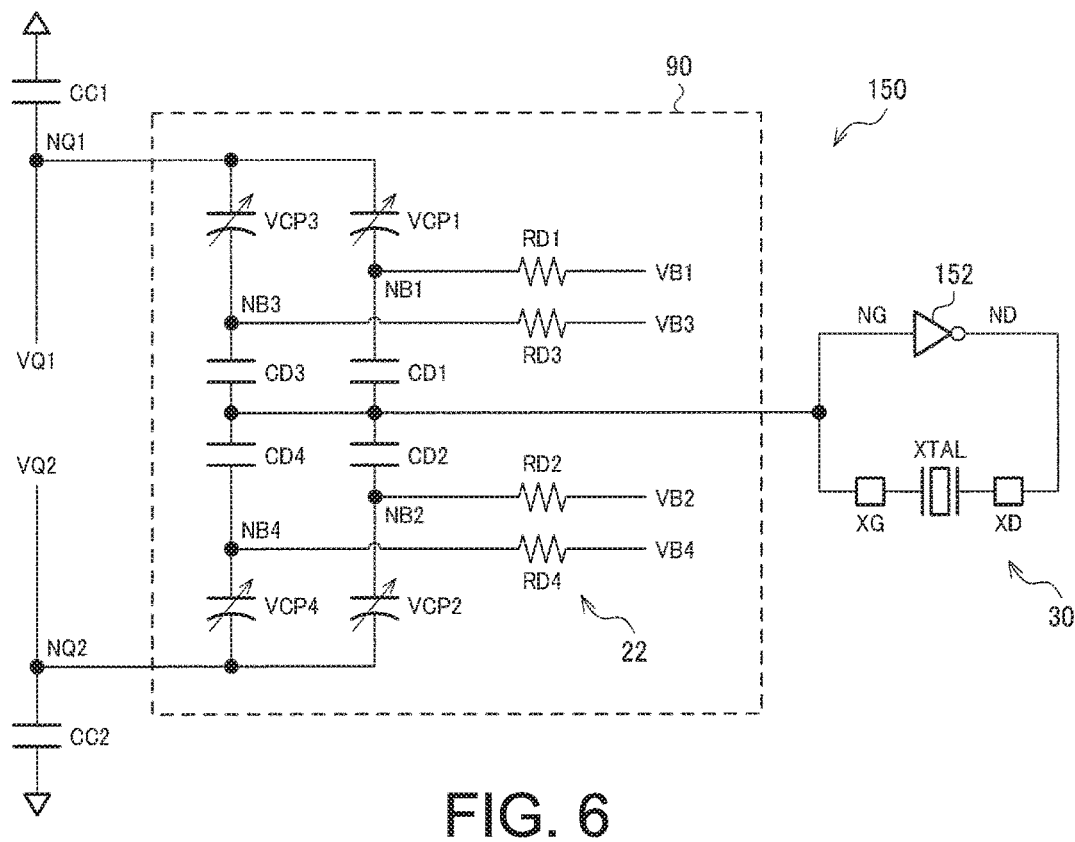
FIG. 6 is a third detailed configuration example of the oscillation circuit.

FIG. 6 is a third detailed configuration example of the oscillation circuit 150. In FIG. 6, the variable capacitance circuit 90 includes variable capacitance capacitors VCP1 to VCP4 and the connection portion 22, and the connection portion 22 includes resistors RD1 to RD4 and capacitors CD1 to CD4.

One ends of the variable capacitance capacitors VCP1 and VCP3 are coupled to the output node NQ1 of the D/A converter circuit 80, and one ends of the variable capacitance capacitors VCP2 and VCP4 are coupled to the output node NQ2 of the D/A converter circuit 80. One end of the resistor RD1 is coupled to the node of the bias voltage VB1, and the other end is coupled to the node NB1 at the other end of the variable capacitance capacitor VCP1. Similarly, one ends of the resistors RD2, RD3, and RD4 are coupled to the nodes of the bias voltages VB2, VB3, and VB4, respectively. The other ends of the resistors RD2, RD3, and RD4 are coupled to the nodes NB2, NB3, and NB4 at the other ends of the variable capacitance capacitors VCP2, VCP3, and VCP4, respectively. One end of the capacitor CD1 is coupled to the node NB1, and the other end is coupled to the oscillation loop 30 (for example, the input node NG of the drive circuit 152). Similarly, one ends of the capacitors CD2, CD3, and CD4 is coupled to the nodes NB2, NB3, and NB4, and the other end is coupled to the oscillation loop 30.

According to the embodiment of FIG. 6, the variable capacitance circuit 90 includes the capacitor CD1 (first capacitor) and a capacitor CD2 (second capacitor). The capacitor CD1 is provided between a coupling node (for example, input node NG) coupled to oscillation loop 30 and the other end of variable capacitance capacitor VCP1. The capacitor CD2 is provided between the coupling node coupled to the oscillation loop 30 and the other end of the variable capacitance capacitor VCP2.

In this way, the other ends of the variable capacitance capacitors VCP1 and VCP2 and the coupling node coupled to the oscillation loop 30 are DC-cut by the capacitors CD1 and CD2. As a result, the bias voltages VB1 and VB2 may be supplied to the other ends of the variable capacitance capacitors VCP1 and VCP2, respectively. That is, it is possible to make the voltages at the other ends of the variable capacitance capacitors VCP1 and VCP2 different. The characteristics of the changes of the capacitance values of the variable capacitance capacitors with respect to the changes of the control voltages influence the characteristics (voltage frequency sensitivity characteristic and KV characteristic) of the changes of the oscillation frequency with respect to the changes of the control voltages. For example, in a case where the variable capacitance capacitor is a MOS capacitor, the characteristic of the change in the capacitance value with respect to the change in the control voltage has an extreme value. In the present embodiment, since the capacitance values of the variable capacitance capacitors VCP1 and VCP2 may be controlled by the potential differences VQ1-VB1 and VB2-VQ2 with reference to the different bias voltages VB1 and VB2, it is possible to make the positions of the extreme values different between the variable capacitance capacitors VCP1 and VCP2. As a result, it is possible to make the characteristic of the change of the oscillation frequency with respect to the change of the control voltage closer to a desirable characteristic. For example, it is possible to expand the range in which the oscillation frequency changes linearly with respect to the control voltage (the range in which the KV characteristic is flat).

In addition, in the embodiment, the variable capacitance circuit 90 includes the variable capacitance capacitor VCP3 (third variable capacitance capacitor) and the variable capacitance capacitor VCP4 (fourth variable capacitance capacitor). In the variable capacitance capacitor VCP3, the voltage signal VQ1 (first voltage signal) is input to one end, and the bias voltage VB3 (third bias voltage) is input to the other end. In the variable capacitance capacitor VCP4, the voltage signal VQ2 (second voltage signal) is input to one end, and the bias voltage VB4 (fourth bias voltage) is input to the other end.

In this way, the variable capacitance capacitor VCP3 is provided in parallel to the variable capacitance capacitor VCP1, and the variable capacitance capacitor VCP4 is provided in parallel to the variable capacitance capacitor VCP2. As a result, it is possible to make the characteristic of the change of the oscillation frequency with respect to the change of the control voltage closer to more desirable characteristic. For example, it is possible to make the characteristics of the changes of the capacitance values with respect to the changes of the control voltages different between the variable capacitance capacitors VCP1 and VCP3 by making the bias voltages VB1 and VB3 to be supplied to the other ends of the variable capacitance capacitors VCP1 and VCP3 different. Similarly, it is possible to make the characteristics of the changes of the capacitance values with respect to the changes of the control voltages different between the variable capacitance capacitors VCP2 and VCP4 by making the bias voltages VB2 and VB4 to be supplied to the other ends of the variable capacitance capacitors VCP2 and VCP4 different.

Figure 7:
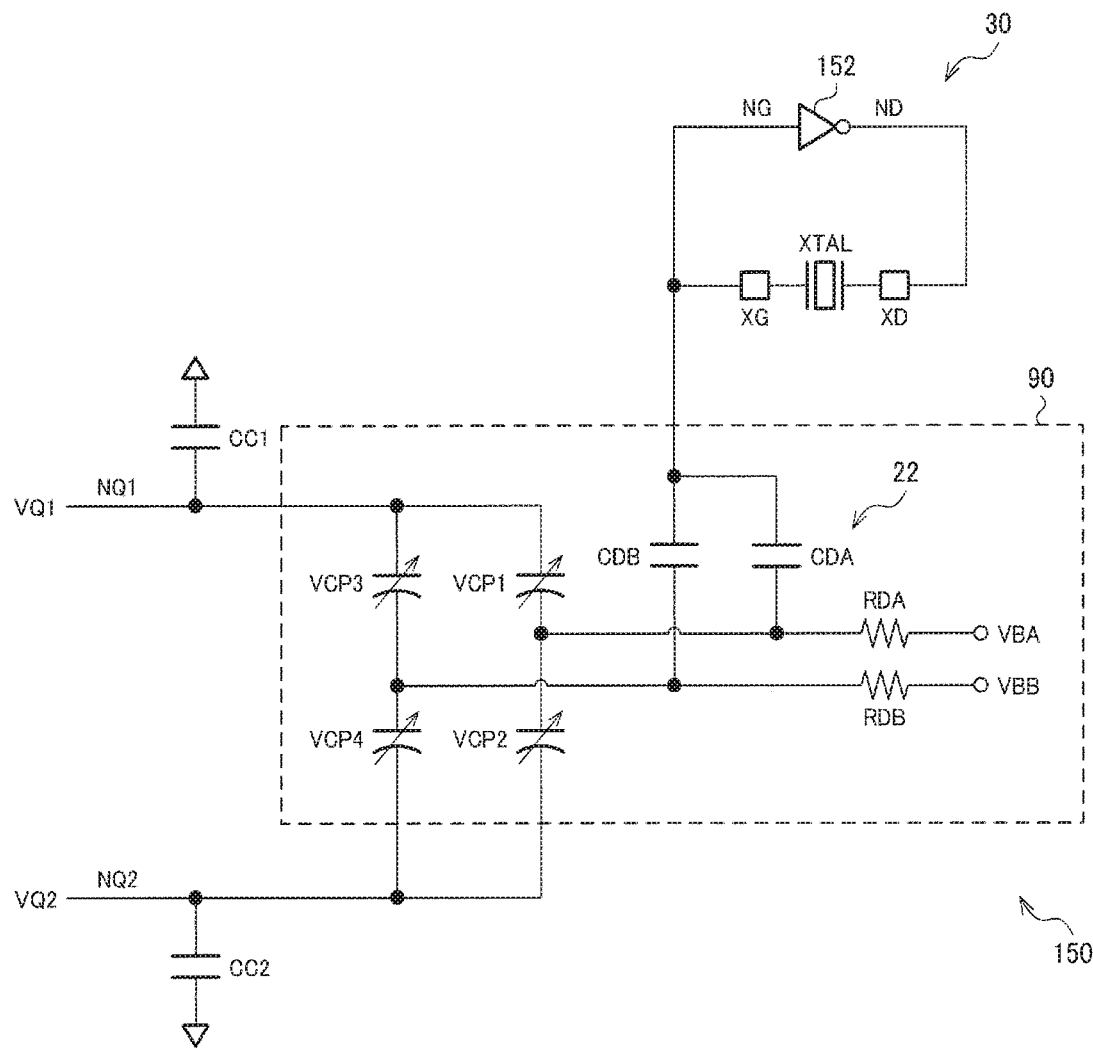
FIG. 7 is a fourth detailed configuration example of the oscillation circuit.

FIG. 7 is a fourth detailed configuration example of the oscillation circuit 150. In FIG. 7, the connection portion 22 includes resistors RDA and RDB and capacitors CDA and CDB.

One ends of the variable capacitance capacitors VCP1 and VCP3 are coupled to the output node NQ1 of the D/A converter circuit 80, and one ends of the variable capacitance capacitors VCP2 and VCP4 are coupled to the output node NQ2 of the D/A converter circuit 80. One end of the resistor RDA is coupled to the node of the bias voltage VBA, and the other end is coupled to the other ends of the variable capacitance capacitors VCP1 and VCP2. One end of the resistor RDB is coupled to the node of the bias voltage VBB, and the other end is coupled to the other ends of the variable capacitance capacitors VCP3 and VCP4. One end of the capacitor CDA is coupled to the other ends of the variable capacitance capacitors VCP1 and VCP2, and the other end is coupled to the oscillation loop 30 (for example, the input node NG of the drive circuit 152). One end of the capacitor CDB is coupled to the other ends of the variable capacitance capacitors VCP3 and VCP4, and the other end is coupled to the oscillation loop 30.

In the embodiment of FIG. 7, the first bias voltage supplied to the other end of the variable capacitance capacitor VCP1 and the second bias voltage supplied to the other end of the variable capacitance capacitor VCP2 are the same voltage (bias voltage VBA). In addition, the third bias voltage supplied to the other end of the variable capacitance capacitor VCP3 and the fourth bias voltage supplied to the other end of the variable capacitance capacitor VCP4 are the same voltage (bias voltage VBB).

Also in the present embodiment, it is possible to make the characteristic of the changes of the oscillation frequency with respect to the changes of the control voltage closer to more desirable characteristic. For example, different bias voltages are supplied to the other ends of the variable capacitance capacitors VCP1 and VCP3, and different bias voltages are supplied to the other ends of the variable capacitance capacitors VCP2 and VCP4 by making the bias voltages VBA and VBB different. As a result, it is possible to make the characteristics of the changes in the capacitance values with respect to the changes of the control voltages different between the variable capacitance capacitors VCP1 and VCP3 and to make the variable capacitance capacitors VCP2 and VCP4 different.

Figure 8:
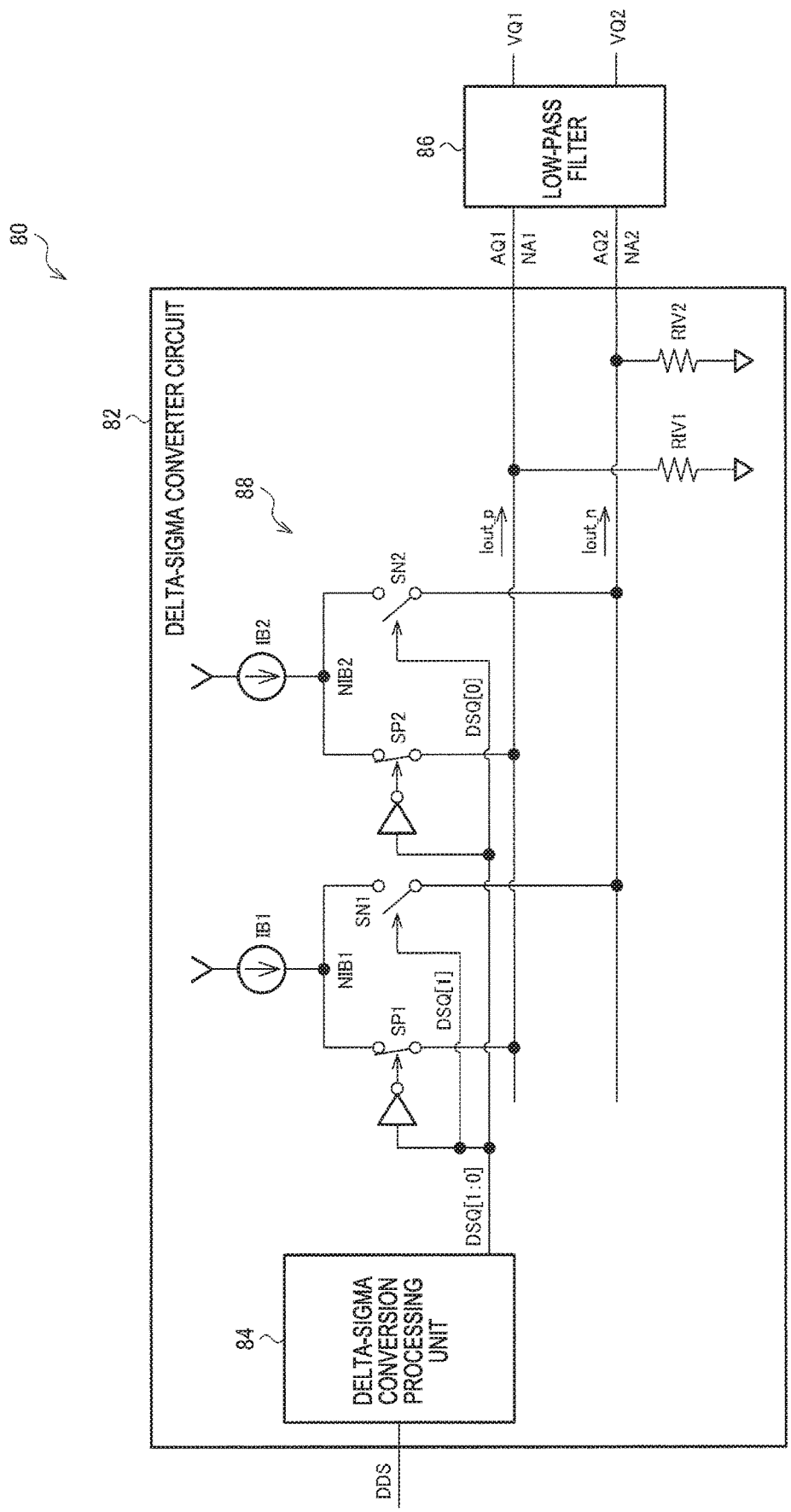
FIG. 8 is a second detailed configuration example of the D/A converter circuit.

FIG. 8 is a second detailed configuration example of the D/A converter circuit 80. In FIG. 8, the delta-sigma converter circuit 82 includes a delta-sigma conversion processing unit 84 and a D/A converter 88 (D/A converter circuit).

The delta-sigma conversion processing unit 84 performs delta-sigma conversion on the frequency control data DDS and outputs 2-bit conversion data DSQ[1:0]. The D/A converter 88 converts the conversion data DSQ[1:0] into differential currents and converts the differential currents into differential voltages. Specifically, the D/A converter 88 includes current sources IB1 and IB2, switches SP1, SN1, SP2, and SN2, and resistors RIV1 and RIV2. The current sources IB1 and IB2 output currents to nodes NIB1 and NIB2, respectively. For example, the current output from the current source IB2 is ½ the current flowing through the current source IB1. The switches SP1 and SN1 are provided between nodes NA1 and NA2, and the node NIB1, respectively. The switches SP2 and SN2 are provided between the nodes NA1 and NA2, and the node NIB2, respectively. One ends of the resistors RIV1 and RIV2 are coupled to the nodes NA1 and NA2, respectively, and the other ends are coupled to the ground node. The switches SP1, SN1, SP2, and SN2 are controlled to be turned on or off by a logic inversion signal of DSQ[1], logic inversion signals of DSQ[1] and DSQ[0], and DSQ[0], respectively. By controlling these switches to be turned on or off, current Iout_p is output to the node NA1 and current Iout_n is output to the node NA2. The currents Iout_p and Iout_n flow to the resistors RIV1 and RIV2, thereby being converted into voltages, and the voltage signals AQ1 and AQ2 are output to the nodes NA1 and NA2.

In FIG. 8, the case where the delta-sigma conversion processing unit 84 outputs 2-bit conversion data has been described as an example, but the invention is not limited thereto. For example, the conversion data may be 1 bit. In that case, the D/A converter 88 may include the current source IB1, the switches SP1 and SN1, and the resistors RIV1 and RIV2. In addition, in a case where the conversion data is 3 bits, three sets of the current source and the switch are provided, and the current output by the current source corresponding to each bit may be weighted with a power of 2.

Figure 9:
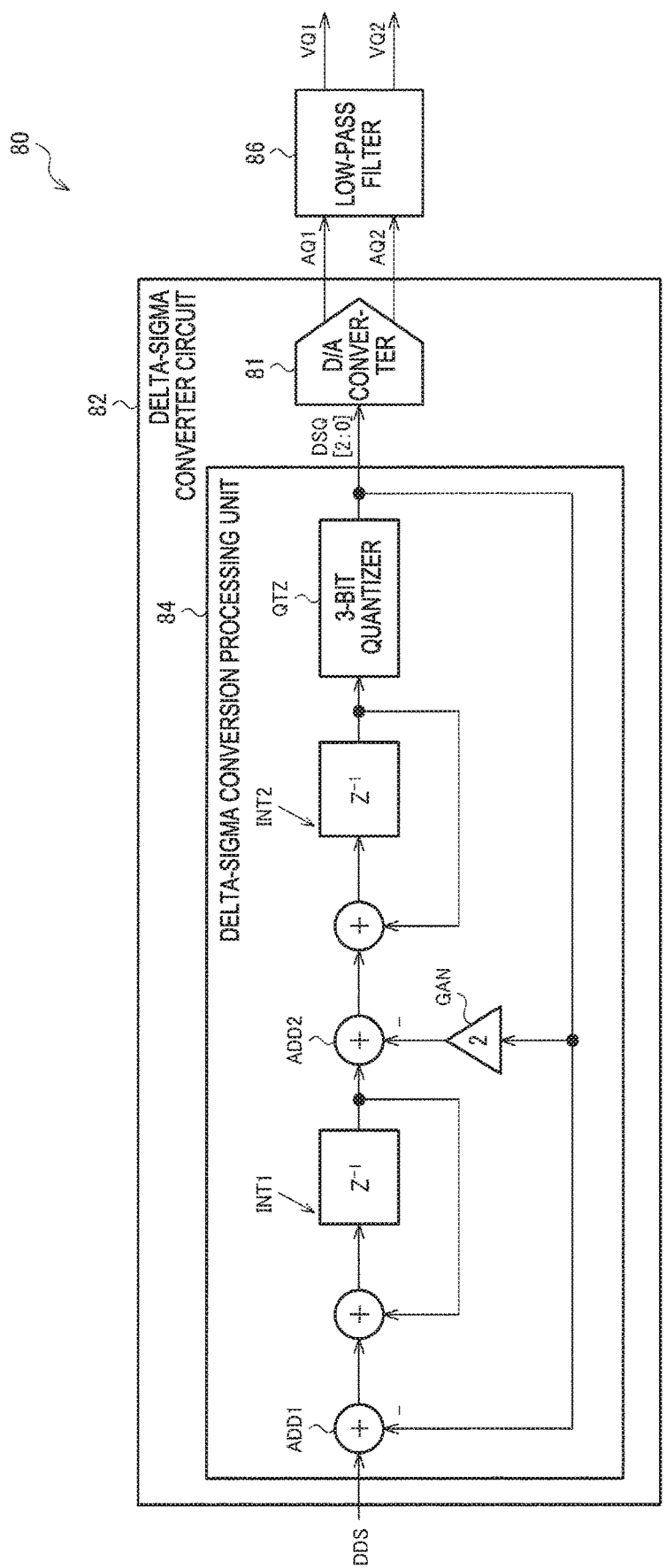
FIG. 9 is a third detailed configuration example of the D/A converter circuit.

FIG. 9 is a third detailed configuration example of the D/A converter circuit 80. In FIG. 9, the delta-sigma converter circuit 82 includes a delta-sigma conversion processing unit 84 for outputting 3-bit conversion data DSQ[2:0] and a D/A converter 81 (D/A converter circuit) for performing D/A conversion on the 3-bit conversion data DSQ[2:0] to output differential signals (AQ1 and AQ2).

The delta-sigma conversion processing unit 84 includes an adder ADD1 (subtracter), an integrator INT1, a multiplier GAN, an adder ADD2, an integrator INT2, and a 3-bit quantizer QTZ. The adder ADD1 subtracts the conversion data DSQ[2:0] from the frequency control data DDS which is input data. The integrator INT1 integrates the output data of the adder ADD1. The multiplier GAN multiplies the conversion data DSQ[2:0] by 2. The adder ADD2 subtracts the output data of the multiplier GAN from the output data of the integrator INT1. The integrator INT2 integrates the output data of the adder ADD2. The 3-bit quantizer QTZ quantizes the output data of the integrator INT2 into 3-bit data and outputs the result as converted data DSQ[2:0]. The D/A converter 81 may be realized by having, for example, the D/A converter 88 described in FIG. 8 in a 3-bit configuration.

In FIGS. 4, 8, and 9, the case where low-pass filter processing is performed on the differential signals (AQ1 and AQ2) output from the delta-sigma converter circuit 82 by the low-pass filter 86 which is a passive filter, has been described as an example, but the configuration for implementing the low-pass filter processing is not limited thereto. For example, the D/A converter circuit 80 may include a switched capacitor filter for performing low-pass filtering on the differential signal output from the delta-sigma converter circuit 82. The switched capacitor filter operates with the clock signal CLK of FIG. 4, for example.

In addition, in FIGS. 4, 8, and 9, the case where the D/A converter circuit 80 performs the delta-sigma conversion processing has been described as an example, but the D/A conversion method is not limited thereto. For example, without performing the delta-sigma conversion processing, the frequency control data DDS is D/A converted by a D/A converter circuit such as a resistance ladder type or a capacitance array type, and differential signals corresponding to the frequency control data DDS are output.

4. Third Configuration Example of Circuit Device

Figure 10:
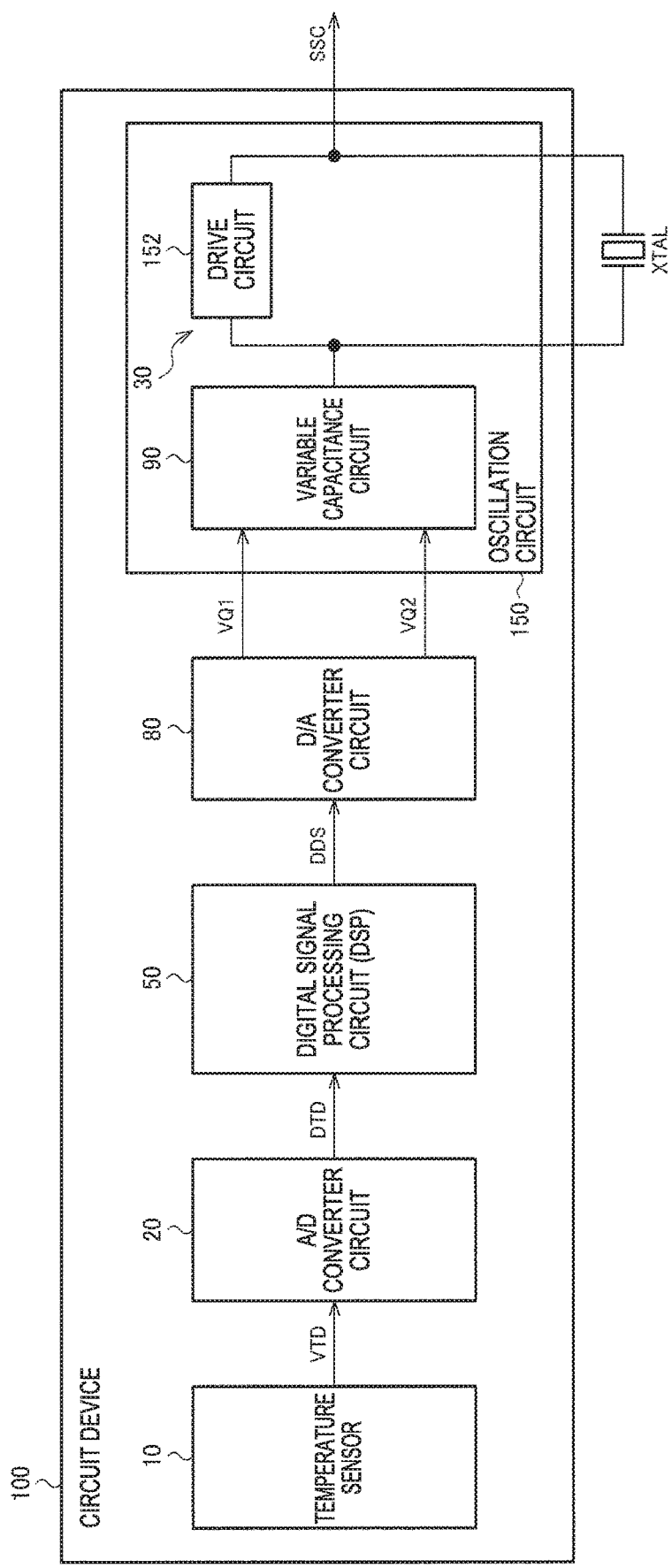
FIG. 10 is a third configuration example of the circuit device.

FIG. 10 is a third configuration example of the circuit device 100. The circuit device 100 is a circuit device (integrated circuit device, semiconductor chip) that realizes a digital oscillator such as a TCXO or an oven-controlled crystal oscillator (OCXO). For example, a digital oscillator is realized by housing this circuit device and the resonator XTAL in a package.

The circuit device 100 includes a temperature sensor 10, an A/D converter circuit 20, a digital signal processing circuit 50 (digital signal processor (DSP)), the D/A converter circuit 80, and the oscillation circuit 150 (VCO). The present embodiment is not limited to the configuration of FIG. 10, and various modifications such as omitting a part of the constituent elements and adding other constituent elements may be made. For example, a temperature sensor may be provided outside the circuit device 100, and a temperature detection voltage may be input from the temperature sensor to the circuit device 100.

The temperature sensor 10 outputs a temperature-dependent voltage that changes depending on the temperature of the environment (for example, a circuit device or a resonator) as a temperature detection voltage VTD. For example, the temperature sensor 10 generates a temperature-dependent voltage by using a circuit element having temperature dependence and outputs the temperature-dependent voltage with reference to a temperature-independent voltage (for example, a band gap reference voltage). For example, the temperature sensor 10 outputs the forward voltage of the PN junction as a temperature-dependent voltage.

The A/D converter circuit 20 performs A/D conversion on the temperature detection voltage VTD from the temperature sensor 10 and outputs the result as temperature detection data DTD. As the A/D conversion method, for example, a successive approximation type, a flash type, a pipeline type, a double-integral type or the like may be adopted.

The digital signal processing circuit 50 performs various signal processing. For example, the digital signal processing circuit 50 (temperature compensation unit) performs temperature compensation processing for compensating for the temperature characteristic of the oscillation frequency of the resonator XTAL based on the temperature detection data DTD and outputs frequency control data DDS for controlling the oscillation frequency. Specifically, the digital signal processing circuit 50 performs temperature compensation processing for canceling or reducing the fluctuations of the oscillation frequency due to the temperature change (keeping the oscillation frequency constant even when temperature changes) based on the temperature detection data DTD (temperature-dependent data) which changes according to the temperature, the coefficient data for temperature compensation processing (data of coefficients of the approximation function), and the like. That is, the frequency control data DDS is obtained by substituting the temperature detection data DTD into an approximate function that cancels or reduces the fluctuations of the oscillation frequency due to the temperature change. The digital signal processing circuit 50 is a digital signal processor (DSP) that executes various signal processing including temperature compensation processing in a time division manner. Alternatively, the digital signal processing circuit 50 may be realized by an ASIC circuit such as a gate array or may be realized by a processor (for example, CPU, MPU, and the like) and a program operating on the processor.

The D/A converter circuit 80 performs D/A conversion on the frequency control data DDS and outputs differential signals (voltage signals VQ1 and VQ2) corresponding to the frequency control data DDS. For example, as the D/A converter circuit 80, the configuration described in FIGS. 4, 8, and 9 may be adopted.

The oscillation circuit 150 oscillates the resonator XTAL with the oscillation frequency corresponding to the differential signal from the D/A converter circuit 80 and outputs the oscillation signal SSC of the oscillation. That is, the oscillation circuit 150 is a voltage-controlled oscillator (VCO) that uses the voltage signals VQ1 and VQ2 constructing the differential signals as control voltages. The oscillation circuit 150 includes the drive circuit 152 driving the resonator XTAL and the variable capacitance circuit 90 coupled to the oscillation loop 30 of the resonator XTAL. In the variable capacitance circuit 90, the capacitance value is variably controlled by the voltage signals VQ1 and VQ2 constituting the differential signals from the D/A converter circuit 80. The oscillation frequency (the frequency of the oscillation signal SSC) of the oscillation circuit 150 is controlled by controlling the capacitance value of the variable capacitance circuit 90. For example, as the oscillation circuit 150, the configuration described in FIGS. 1 and 4 to 7 may be adopted.

5. Oscillator, Electronic Apparatus, and Vehicle

Figure 11:
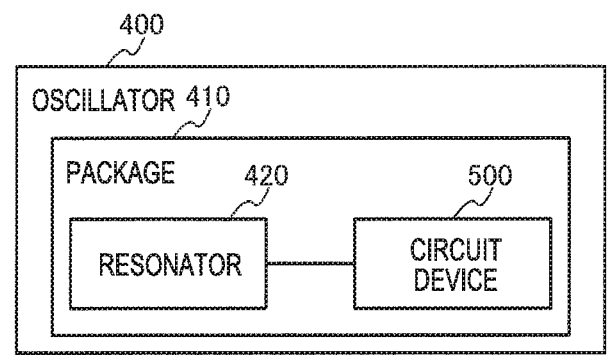
FIG. 11 is a configuration example of an oscillator.

FIG. 11 shows a configuration example of an oscillator 400 including a circuit device 500 of the present embodiment. The oscillator 400 includes a resonator 420 (oscillator)

and the circuit device 500. The circuit device 500 corresponds to the circuit device 100 in FIG. 1 and the like, and the resonator 420 corresponds to the resonator XTAL in FIG. 1 and the like. The resonator 420 and the circuit device 500 are mounted in a package 410 of the oscillator 400. The terminal of the resonator 420 and the terminal (pad) of the circuit device 500 (IC) are electrically connected by the internal wiring of the package 410.

The configuration of the oscillator including the circuit device 500 of the present embodiment is not limited to FIG. 11. For example, the terminals of the resonator 420 are coupled to the terminals of the circuit device 500 by metal bumps, whereby the resonator 420 is mounted right above the semiconductor chip of the circuit device 500, and the circuit device 500 and the resonator 420 are built in the package 410.

Figure 12:
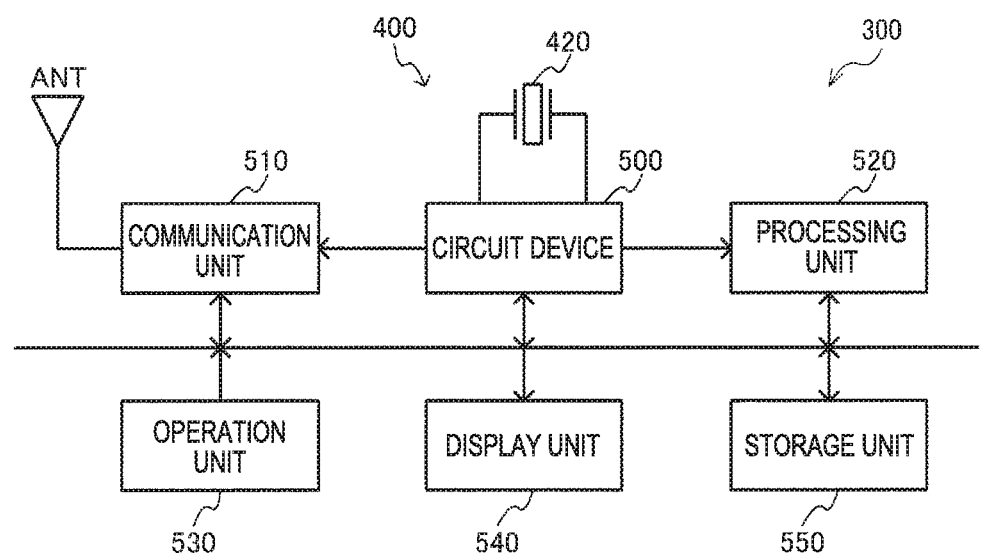
FIG. 12 is a configuration example of an electronic apparatus.

FIG. 12 is a configuration example of an electronic apparatus 300 including the circuit device 500 of the present embodiment. This electronic apparatus 300 includes the oscillator 400 having the circuit device 500 and the resonator 420, and a processing unit 520. In addition, the electronic apparatus 300 may include a communication unit 510, an operation unit 530, a display unit 540, a storage unit 550, and an antenna ANT.

It is possible to assume various apparatuses as the electronic apparatus 300. For example, it is possible to assume a wearable device such as a GPS built-in timepiece, a biological information measurement device (pulse wave meter, pedometer, and the like) or a head-mounted display device. Alternatively, it is possible to assume a mobile information terminal (mobile terminal) such as a smartphone, a mobile phone, a portable game device, a notebook PC or a tablet PC. Alternatively, it is possible to assume a content providing terminal that distributes content, a video device such as a digital camera or a video camera, or a network related device such as a base station or a router. Alternatively, it is possible to assume a measurement instrument for measuring physical quantities such as distance, time, flow rate or flow amount, an in-vehicle device (device for automatic driving and the like), a robot, and the like.

The communication unit 510 (wireless circuit) receives data from the outside via the antenna ANT and performs processing for transmitting data to the outside. The processing unit 520 performs control processing of the electronic apparatus, various digital processing of data transmitted and received via the communication unit 510, and the like. The function of the processing unit 520 may be realized by a processor such as a microcomputer. The operation unit 530 is for a user to perform an input operation and may be realized by an operation button, a touch panel display, or the like. The display unit 540 displays various kinds of information and may be realized by a display such as liquid crystal or organic EL. The storage unit 550 stores data, and the function thereof may be realized by a semiconductor memory such as RAM or ROM, a hard disk drive (HDD), or the like.

Figure 13:
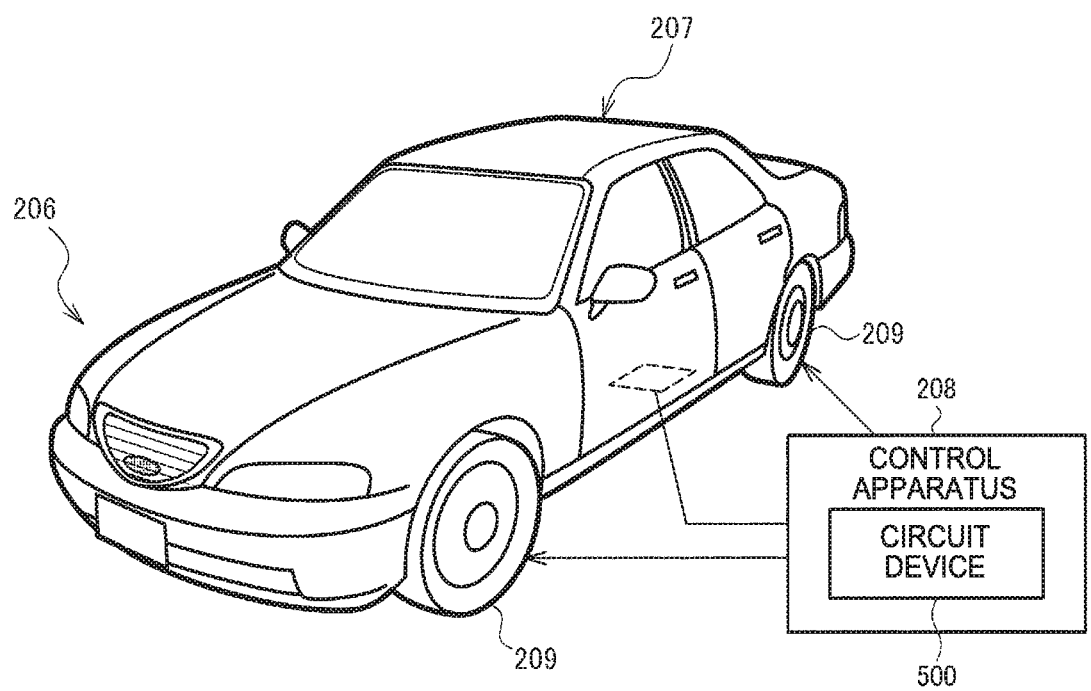
FIG. 13 is an example of a vehicle.

FIG. 13 is an example of a vehicle including the circuit device 500 of the present embodiment. The circuit device 500 of the present embodiment may be incorporated in various vehicles such as a car, an airplane, a motorcycle, a bicycle, a robot, a ship, or the like. The vehicle is a device/apparatus that moves on the ground, the sky, or the sea including a drive mechanism such as an engine and a motor, a steering mechanism such as a steering wheel and a rudder, and various kinds of electronic apparatus (in-vehicle device). FIG. 13 schematically shows an automobile 206 as a specific example of a vehicle. An oscillator (not shown) including the circuit device 500 of the present embodiment is incorporated in the automobile 206. A control apparatus 208 performs various control processing based on the oscillation signal (clock signal) generated by the oscillator. The control apparatus 208 controls the hardness of the suspension according to the attitude of a vehicle body 207, for example, and controls the brakes of individual wheels 209. The device into which the circuit device 500 (oscillator) of the present embodiment is incorporated is not limited to such the control apparatus 208, and the circuit device 500 may be incorporated in various devices provided in a vehicle such as the automobile 206 or a robot.

As described above, the present embodiment has been described in detail, but those skilled in the art will easily understand that many modifications may be made without deviating practically from the novel matters and effects of the invention. Therefore, all such modifications are included in the scope of the invention. For example, in the specification or drawings, terms described together with different terms that are broader or equivalent at least once may be replaced with different terms at any point in the specification or drawings. In addition, all combinations of the present embodiment and modifications are included in the scope of the invention. Further, configurations, operations, and the like of the circuit device, the oscillator, the electronic apparatus, or the vehicle are not limited to those described in the present embodiment, and various modifications may be made.

The entire disclosure of Japanese Patent Application No. 2017-240161, filed Dec. 15, 2017 is expressly incorporated by reference herein.

What is claimed is:

1. A circuit device comprising:
    an oscillation circuit that includes
        a drive circuit driving a resonator, and
        a variable capacitance circuit coupled to an oscillation loop including the resonator and the drive circuit; and
    a D/A converter circuit that performs D/A conversion on frequency control data and outputs a first voltage signal and a second voltage signal which are differential signals corresponding to the frequency control data,
    wherein the variable capacitance circuit includes
        a first variable capacitance capacitor, to one end of which the first voltage signal is input and, to the other end of which a first bias voltage is input, and
        a second variable capacitance capacitor, to one end of which the second voltage signal is input and, to the other end of which a second bias voltage is input.

2. The circuit device according to claim 1,
    wherein the first bias voltage and the second bias voltage are the same voltage.

3. The circuit device according to claim 2,
    wherein the variable capacitance circuit includes
        a coupling node coupled to the oscillation loop,
        a connection node connecting the other end of the first variable capacitance capacitor and the other end of the second variable capacitance capacitor, and
        a capacitor provided between the coupling node and the connection node.

4. The circuit device according to claim 1,
    wherein the variable capacitance circuit includes
        a first capacitor provided between a coupling node coupled to the oscillation loop and the other end of the first variable capacitance capacitor, and a second capacitor provided between the coupling node and the other end of the second variable capacitance capacitor.

5. The circuit device according to claim 1,
wherein the variable capacitance circuit includes
a third variable capacitance capacitor, to one end of which the first voltage signal is input and, to the other end of which a third bias voltage is input, and
a fourth variable capacitance capacitor, to one end of which the second voltage signal is input and, to the other end of which a fourth bias voltage is input.

6. The circuit device according to claim 5,
wherein the third bias voltage and the fourth bias voltage are the same voltage.

7. The circuit device according to claim 1, further comprising:
a first ground capacitor provided between a first node to which one end of the first variable capacitance capacitor is connected and to which the first voltage signal is input and a ground node; and
a second ground capacitor provided between a second node to which one end of the second variable capacitance capacitor is connected and to which the second voltage signal is input and the ground node.

8. The circuit device according to claim 1,
wherein the D/A converter circuit includes
a delta-sigma converter circuit that performs delta-sigma conversion on the frequency control data and outputting differential conversion signals, and
a low-pass filter that performs differential low-pass filter processing on the differential conversion signals and outputting the D/A converted voltage signals of the differential signals.

9. The circuit device according to claim 8,
wherein the low-pass filter includes
a first ground capacitor provided between a first node to which one end of the first variable capacitance capacitor is connected and a ground node, and
a second ground capacitor provided between a second node to which one end of the second variable capacitance capacitor is connected and the ground node, and
the low-pass filter performs the low-pass filter processing using the first ground capacitor and the second ground capacitor, outputs the first voltage signal to the first node, and outputs the second voltage signal to the second node.

10. An oscillator comprising:
the circuit device according to claim 1; and
the resonator.

11. An oscillator comprising:
the circuit device according to claim 2; and
the resonator.

12. An oscillator comprising:
the circuit device according to claim 3; and
the resonator.

13. An oscillator comprising:
the circuit device according to claim 4; and
the resonator.

14. An electronic apparatus comprising:
the circuit device according to claim 1.

15. An electronic apparatus comprising:
the circuit device according to claim 2.

16. An electronic apparatus comprising:
the circuit device according to claim 3.

17. An electronic apparatus comprising:
the circuit device according to claim 4.

18. A vehicle comprising:
the circuit device according to claim 1.

19. A vehicle comprising:
the circuit device according to claim 2.

20. A vehicle comprising:
the circuit device according to claim 3.

* * * * *